US006324387B1

United States Patent
Kamgar et al.

(10) Patent No.: US 6,324,387 B1
(45) Date of Patent: Nov. 27, 2001

(54) LNA CONTROL-CIRCUIT FOR RECEIVE CLOSED LOOP AUTOMATIC GAIN CONTROL

(75) Inventors: Farbod Kamgar, Campbell, CA (US); Antoine J. Rouphael, Indialantic, FL (US); Mariam Motamed, San Francisco, CA (US)

(73) Assignee: Philips Electronics N.A. Corp., New York, NY (US)

( * ) Notice: Subject to any disclaimer, the term of this patent is extended or adjusted under 35 U.S.C. 154(b) by 0 days.

(21) Appl. No.: 09/222,400

(22) Filed: Dec. 29, 1998

(51) Int. Cl.[7] .................. H04B 1/06; H04B 7/00
(52) U.S. Cl. .................. 455/234.1; 455/232.1; 455/234.2; 455/247.1; 455/246.1; 455/250.1; 375/345
(58) Field of Search .................. 455/232.1, 234.1, 455/240.1, 246.1, 247.1, 250.1, 127, 522, 234.2; 375/345

(56) References Cited

U.S. PATENT DOCUMENTS

| 5,134,707 | * | 7/1992 | Sakashita et al. ............. 455/234.1 |
| 5,452,473 | | 9/1995 | Weiland et al. ................ 455/88 |
| 5,469,115 | | 11/1995 | Peterzell et al. .............. 330/129 |
| 5,617,060 | * | 4/1997 | Wilson et al. ................. 455/239.1 |
| 5,732,341 | * | 3/1998 | Wheatley, III ............... 455/234.1 |
| 5,758,271 | * | 5/1998 | Rich et al. .................... 455/234.1 |
| 5,768,694 | | 6/1998 | Kumagai ....................... 455/126 |
| 6,009,129 | * | 12/1999 | Kenney et al. ................ 455/234.1 |
| 6,052,566 | * | 4/2000 | Abramsky et al. ............. 455/251.1 |

FOREIGN PATENT DOCUMENTS

| 0725479A1 | 8/1996 | (EP) | .................. H03G/3/20 |
| 0706730B1 | 4/1998 | (EP) | .................. H03G/3/30 |
| 0366485A2 | 2/1990 | (EP) | .................. H04B/7/005 |
| WO9710644 | 3/1997 | (WO) | .................. H03G/3/30 |

* cited by examiner

Primary Examiner—Dwayne Bost
Assistant Examiner—Lewis G. West
(74) Attorney, Agent, or Firm—Dicran Halajian

(57) ABSTRACT

A controlled receive device is disclosed having an amplifier circuit, which receives an input signal, and a control circuit which receives the input signal and outputs a controlled signal to a receiver. The receiver outputs an output signal. A controller varies the gain of the amplifier circuit in response to levels of the controlled signal and the output signal. The control circuit outputs a controlled indicator signal indicative of a level of the controlled signal and the receiver outputs an output indicator signal indicative of the output signal level. The controlled indicator signal and the output indicator signal are compared using comparators, to respective reference or threshold levels for producing control signals used by the controller for varying the amplifier gain.

13 Claims, 2 Drawing Sheets

LNA CONTROL-CIRCUIT FOR RECEIVE CLOSED LOOP AUTOMATIC GAIN CONTROL

BACKGROUND OF THE INVENTION

1. Field of the Invention

The present invention is directed to radio communication, and more particularly, to power control in a receiver having a low noise amplifier (LNA) with an adjustable gain which is controlled by a closed loop automatic gain control (AGC).

2. Discussion of the Prior Art

Several different modulation schemes are used for wireless mobile phones. One modulation method is the code division multiple access (CDMA) scheme where signals are broadband and occupy several channels. This is in contrast to the frequency division multiple access (FDMA) scheme where signals are narrowband and occupy one channel at a time. For optimal performance in wireless phones using CDMA, the power level of transmitted signals within the channels must be carefully controlled.

In a CDMA network, an induced interference, e.g. from other competing networks such as from the Advanced Mobile Phone Service (AMPS), has been recognized to have an adverse effect on the voice quality. Theoretically this interference can be minimized by allocating to each operator a dedicated spectrum. However, a mobile station (MS) experiences the competitor induced interference when the MS comes within a close vicinity of the competitor base station. This degrades performance and even causes a drop call where a call is lost.

Although, the competitor's interference resides on different spectrum, the nonlinearity in the receiver's components, e.g. the low noise amplifier (LNA), causes intermodulation, referred to as MIM, which is a source of co-channel and adjacent channel interference. The major source of MIM is the LNA. The present invention is related to a technique which minimize co-channel interference and hence increases the performance of the receiver.

SUMMARY OF THE INVENTION

The object of the present invention is to provide a controlled receive device and control method which eliminates the problems of conventional receive devices.

Another object of the present invention is to provide a controlled receive device and method having minimal performance degradation.

A further object of the present invention is to provide a controlled receive device and method which minimizes out of band interferences and increase the performance of a receiver.

A still further object of the present invention is to provide a controlled receive device and method which dynamically adjust the gain of a low noise amplifier (LNA) to an optimal value by discrete gain-steps.

The present invention accomplishes the above and other objects by providing a controlled receive device having an amplifier circuit, which receives an input signal, and a control circuit which receives the input signal and outputs a controlled signal to a receiver. The receiver outputs an output signal. A controller varies the gain of the amplifier circuit in response to levels of the controlled signal and the output signal.

The control circuit outputs a controlled indicator signal indicative of a level of the controlled signal and the receiver outputs an output indicator signal indicative of the output signal level. The controlled indicator signal and the output indicator signal are compared, e.g., using comparators, to respective reference or threshold levels for producing control signals used by the controller for varying the amplifier gain.

Illustratively, the controller decreases the amplifier gain when the output signal is less than an output threshold level and the controlled signal is greater than a controlled threshold level. Further, the controller increases the amplifier gain when the output signal is less than the output threshold level and the controlled signal is less than the indicator threshold level. Further, the controller keeps the amplifier gain unchanged when the output signal is greater than the output threshold level.

In another embodiment, a control method is disclosed which includes the steps of:

increasing a gain of an amplifier circuit which receives an input signal when a controlled signal from a control circuit connected to the amplifier circuit is less than a controlled threshold level and an output signal of a receiver connected to the control circuit is less than an output threshold level; and decreasing the gain when the controlled signal is greater than the controlled threshold level and the output signal is less than the output threshold level.

A further steps includes maintaining the gain unchanged when the output signal is greater than the output threshold level.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

The present invention relates generally to a communication method using spread spectrum. and specifically to methods for reducing intermodulation interference by controlling an low noise amplifier (LNA) with an adjustable gain in an IS-95 CDMA communication standard.

Figure 1:
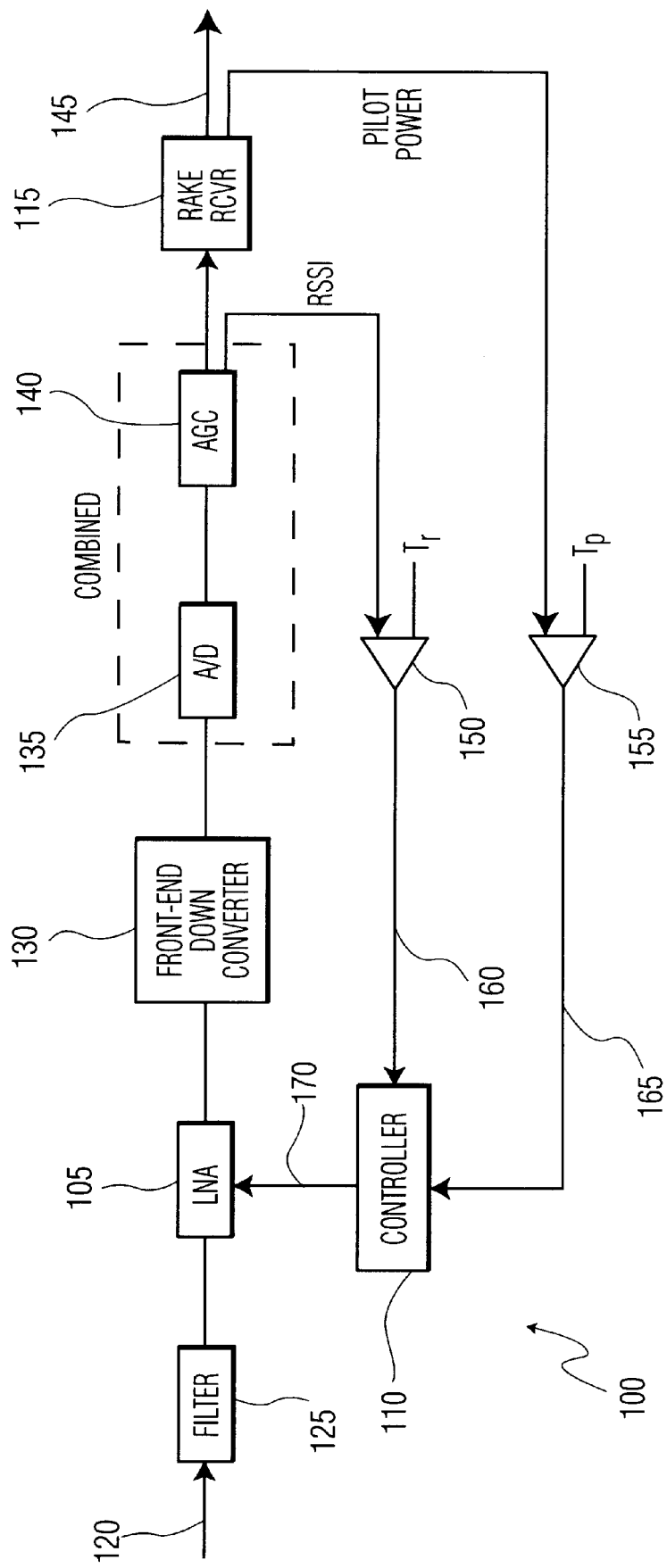
FIG. 1 shows a controlled receive device having a variable gain low noise amplifier (LNA) and an automatic gain control (AGC) according to present invention.

FIG. 1 shows a controlled receive device 100 for receiving signals which are to be controlled by an automatic gain control (AGC). The controlled receive device 100 has improved qualities and is capable of detecting signals having varying signal levels without degradation. This is achieved by controlling the gain of a front end LNA 105 using a controller 110 where the detrimental effects of the LNA non-linearity are minimized.

In particular, due to the non-linearity of the LNA 105, the out-of-band interferences, which are not within the operation frequency of the receive device 100, can create in-band interferences. However, the interferences can be minimized, resulting in an increase of the receiver performance, using the inventive controlled receive device 100 and detection method, where the gain of the LNA 105 is changed accordingly to correct errors due to the LNA's non-linearity, for example.

Further, the controlled receiver device 100 is capable of detecting low power signals by increasing the gain of the LNA 105, and detecting high power signals without causing saturation by decreasing the gain of the LNA 105. The output of the LNA 105 is eventually provided to a receiver unit 115, which is a RAKE receiver for example.

In cellular radio channels, the input radio frequency (RF) signal 120, typically received by an antenna, may contain a strong continuous-waveform (CW) interference tone with energy in the order of 70 dB above the input energy. A filter 125, such as a wide band filter, is used in the receiver's front end to limit the received energy. As is well known in the art, additional filters downstream are used to attenuate out-of-band interferences present in the input signal 120. Typically, out-of-band filtering is performed after down converting the RF signal to an intermediate frequency (IF) signal.

It is noteworthy that, in the presence of out-of-band CW tones at the input signal 120 provided to the LNA 125, in-band interferences, i.e. in-band CW tones, are generated due to non-linearity of LNA 125, known as third order intercept point (IP3) characteristics. The (IP3) characteristics predict the receivers intermodulation (MIM) performance, which describes the radio's susceptibility to interference from adjacent or nearby users. In turn, the in-band CW interferences degrade the signal and the receiver performance. For example, the in-band CW interference may saturate analog to digital converters (A/Ds) present in typical receivers. It is further noteworthy that the power of the generated in-band CW interference or tones are directly proportional to the gain of LNA 105.

The output of the filter 125 is a filtered signal which is provided to the LNA 105 for amplification. However, in the presence of a large CW tone, and due to limited dynamic range of the A/Ds, the system's A/Ds may be driven into saturation, thus degrading the performance of the receiver 100. Consequently, the low noise amplifier 105 is used in the receiver's front end having a variable gain which is changed to limit the received signal's power.

The output of the LNA 105 is provided to a front end down converter 130 which down converts the RF signal to an IF signal and then to baseband. The baseband signal is provided to an A/D 135 which digitizes the baseband signal and provides a digital signal to an AGC unit 140. The AGC unit 140 stabilizes the varying AGC input signal to output a stable signal.

In FIG. 1, the AGC unit 140 is shown combined with the A/D 135, and as understood by those skilled in the art of radio communications, the AGC 140 includes interconnected circuit elements, such as digital to analog converter D/A and a voltage controlled amplifier (VGA). Illustratively, the AGC 140 is a closed loop AGC, where the gain of the VGA is changed to maintain a constant output signal.

As is well known in the art, the down converter 130 includes a mixer that receives the RF or IF signal and a locally oscillating signal to output a baseband signal or signals, such as I and Q signals which are 90° apart in phase. The baseband signal is converted to digital form by the A/D 135 for further digital processing. The processed digital signal is converted to analog form by a D/A for use in controlling the VGA.

Figure 2:
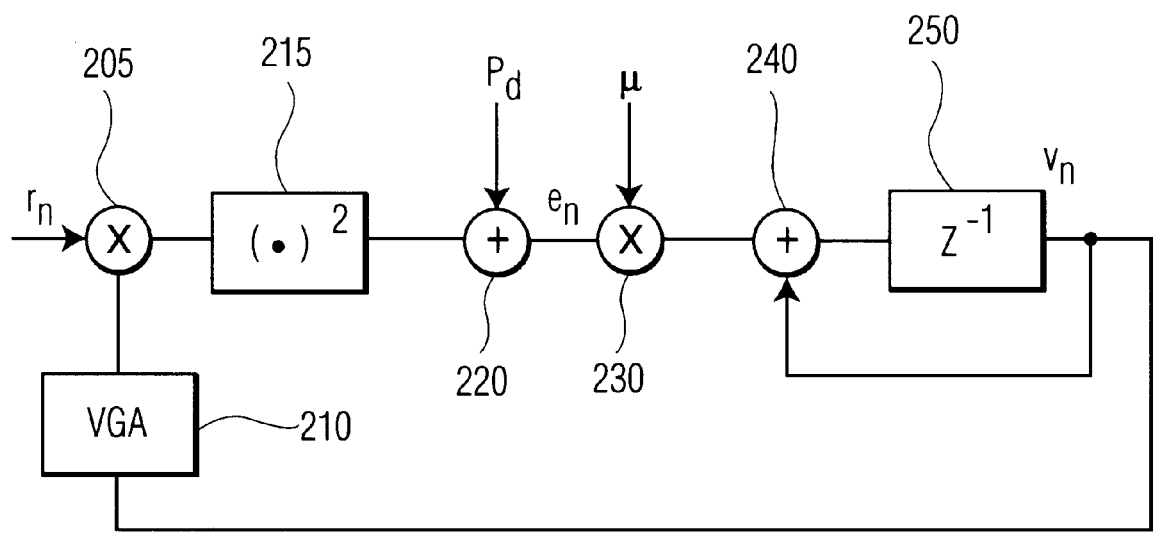
FIG. 2 shows the closed loop automatic gain control (AGC) shown in FIG. 1 in greater detail according to present invention.

An illustrative discrete time AGC loop 200 is shown in FIG. 2, which is used at the front end of a one channel receiver to stabilize signal levels that vary widely due to channel characteristics. The received signal $r_n$ is provided to a mixer which also receives a signal from a VGA 210. The mixed signal output from the mixer 205 is provided to a squaring unit 215 whose output is provided to an adder 220. A constant $P_d$, which denotes the desired signal power level, is combined, e.g., added by an adder 220, with the output of the squaring unit 215 to provide an error signal $e_n$. A weighing factor, such as a constant $\mu$, is combined with the error signal $e_n$, e.g., using a multiplier 230.

The weighted error signal from the multiplier 230 is provided, through a second combiner, e.g., adder 240, to a loop filter 250, for example. The output $v_n$ of the loop filter 250 is fed back to the second adder 240. Further, the filter output $v_n$ is fed back to the first multiplier or mixer 205 through the VGA 210, which typically has an exponential characteristic with an output described by $Ge^{\alpha x}$, where x is the output of the loop filter 250, namely, $v_n$, and G and $\alpha$ are constants. Where desired or required, A/D and D/A converters may be provided. For example, an A/D may be provided between the mixer 205 and the squaring unit 215 and a D/A may be provided between the loop filter 250 and the VGA 210.

Returning to FIG. 1, the received signal $r_n$ by the AGC 140 is a complex value signal, for example, which contains an in-phase component, $r_{i,n}$, and a quadrature component $r_{q,n}$. Therefore, the squaring operation of the squaring unit 215 performs $r_{i,n}^2 + r_{q,n}^2$ function.

As shown in FIG. 1, the stabilized signal from the AGC 140 is provided to a detector or receiver, such as a RAKE receiver 115, which demodulates the signal for the purpose of extracting the transmitted information. Note that the input signal 120, after the down conversion 130, can have in-phase and quadrature components which then will require two A/D's, i.e., one A/D for each component.

Further, it is understood that the AGC 140 includes a detector to output a received signal strength indicator (RSSI) signal, which is typically a signal whose amplitude varies as a function of the amplitude of the AGC output signal. Similarly, the RAKE receiver outputs a signal which is the sum of N pilot power signals, where N is the number of fingers in the RAKE receiver. Each pilot power signal is indicative of the pilot power due to a given finger.

The RSSI signal and the sum of pilot power signals are provided to respective comparators. In particular, the RSSI signal is provided to a first voltage comparator 150, referred to as an RSSI comparator 150, and the sum of pilot power signals is provided to a second voltage comparator 155, referred to as a pilot comparator 155. Each comparator 150, 155 also receives its own reference signal, where the RSSI comparator 150 receives an RSSI reference voltage reference Tr and the pilot comparator 155 receives a pilot reference voltage reference Tp.

The outputs 160, 165 of the comparators 150, 155 toggle between two states depending on whether the overall received signal levels are greater or less than the threshold signals Tr, Tp, respectively. The comparator outputs 160, 165 are connected to the controller 110, which is a microcontroller for example. A control signal 170 from the microcontroller 110 is provided to a control port 175 of the LNA 105.

Parameter settings for controlling the LNA 105 depend on the actual parameters of the radio channel. These parameters may be obtained by measurements or via simulations of the combined LNA and receive automatic gain control loop. In particular, the parameters used to control the LNA 105 are based on the following inputs:

(1) the overall power of the received signal power provided from the RAKE receiver 115, as represented by the sum of pilot powers; and (2) the received signal strength indicator (RSSI) of the strongest pilot signal from the AGC 140.

The gain of the LNA 105 is adjusted based on the two inputs 160, 165 to the micro controller 110, such that the AGC loop operates with lowest frame error rate (FER), i.e., optimal system performance, with minimal power dissipation. Unlike conventional receive systems which set the LNA at a constant gain, or operate it as an on-off gain switch, the controlled receive device 100, where the LNA gain adjustment is based on the two inputs 160, 165 to the micro controller 110, allows the system to set the LNA gain to an optimal value to maximize system performance.

The LNA gain is adjusted upward or downward by discrete gain-steps, for example, according to the following rules as summarized in Table 1 showing various conditions for LNA gain adjustments.

TABLE 1

| | RSSI Level | Sum of Pilot Power | LNA Gain |
|---|---|---|---|
| condition 1 | ≧Tr | ≧Tp | no change |
| condition 2 | ≧Tr | <Tp | decrease |
| condition 3 | <Tr | ≧Tp | no change |
| condition 4 | <Tr | <Tp | increase |

As shown in Table 1, the following rules are used in adjusting the LNA gain:

1. If the overall signal power, as represented by the RSSI signal from the AGC 140, is higher than or equal to the set RSSI signal power threshold Tr, and the sum of pilot powers, also referred to as a pilot RSSIp since it is the sum of pilot powers, is higher than or equal to the set pilot threshold Tp, then the LNA gain is left unchanged.

2. If the RSSI signal from the AGC 140 is higher than or equal to the set RSSI signal power threshold Tr, and the sum of pilot powers is less than the set pilot threshold Tp, then too much interference may be overloading the system's A/D(s) and the LNA gain is lowered in discrete steps until another condition is satisfied or the minimum LNA gain $L_{min}$ is reached.

3. If the RSSI signal from the AGC 140 is less than the set RSSI signal power threshold Tr, and the sum of pilot powers is greater than or equal to a set pilot threshold Tp, then the system is operating in the presence of negligible interference and the LNA gain is left unchanged.

4. If the RSSI signal from the AGC 140 is less than the set RSSI signal power threshold Tr, and the sum of pilot powers is less than the set pilot threshold Tp, then the signal power is too low, and the LNA gain is increased in discrete steps until another condition is satisfied or the LNA maximum gain $L_{max}$ is reached.

Illustratively, the LNA circuitry is designed to provide a maximum gain of 10 dB ($L_{max}$=10 dB), and the LNA gain is adjusted by discrete gain-steps between a minimum gain of 0 dB ($L_{min}$=0 dB) and the maximum LNA gain $L_{max}$, which is for example 10 dB. The threshold Tr for the total received signal power as represented by the RSSI signal from the AGC 140 depends on the value the desired power Pd in the AGC loop, as shown in FIG. 2. The pilot signal threshold $T_p$ is determined as a function of the total transmitted pilot energy. For IS-95 signals in a fading channel with a Doppler of 300 Hz, and an AGC desired power setting of $P_d$=0.625, simulations of the combined LNA and AGC system 100 indicate that a value of $T_r$=0.04 and $T_p$=8000 yield satisfactory performance.

Illustratively, the controlled receive device 100 is used wireless telephones or handsets with code division multiple access (CDMA) modulation, such as cellular CDMA phones.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

What is claimed is:

1. A controlled receive device comprising:

an amplifier circuit which receives an input signal;

a control circuit which receives said input signal and outputs a controlled signal;

a receiver circuitry which receives said controlled signal and outputs an output signal; and a controller which varies a gain of said amplifier circuit in response to a controlled signal level of said controlled signal and an output signal level of said output signal, wherein said controller decreases said gain when said output signal is less than an output threshold level and said controlled signal is greater than an indicator threshold level.

2. The controlled receive device of claim 1, wherein said controller is connected in a first feedback loop of said amplifier circuit and said receiver and in a second feedback loop of said amplifier circuit and said control circuit.

3. The controlled receive device of claim 1, wherein said amplifier circuit includes a low noise amplifier having a variable gain.

4. The controlled receive device of claim 1, wherein said control circuit outputs a controlled indicator signal indicative of said controlled signal level and said receiver outputs an output indicator signal indicative of said output signal level, said controlled indicator signal and said output indicator signal being compared to respective reference levels for producing control signals used by said controller for varying said gain of said circuit amplifier.

5. The controlled receive device of claim 1, further comprising a first comparator which compares a controlled indicator signal, which is received from said control circuit and is indicative of said controlled signal level, with a first predetermined value and provides a first control signal to said controller; and a second comparator which compares an output indicator signal, which is received from said receiver and is indicative of said output signal level, with a second predetermined value and provides a second control signal to said controller.

6. The controlled receive device of claim 1, wherein said controller increases said gain when said output signal is less than an output threshold level and said controlled signal is less than an indicator threshold level.

7. The controlled receive device of claim 1, wherein said controller keeps said gain unchanged when said output signal is greater than an output threshold level.

8. The controlled receive device of claim 1, wherein said output signal level is a sum of pilot power signals from fingers of said receiver.

9. A receive device comprising:

means for increasing a gain of an amplifier circuit which receives an input signal when a controlled signal from a control circuit connected to said amplifier circuit is less than a controlled threshold level and an output signal of a receiver connected to said control circuit is less than an output threshold level; and means for decreasing said gain when said controlled signal is greater than said controlled threshold level and said output signal is less than said output threshold level.

10. The receive device of claim 9 further comprising means for maintaining said gain unchanged when said output signal is greater than said output threshold level.

11. The receive device of claim 9, wherein said output signal is a sum of pilot power signals from fingers of said receiver.

12. A method for controlling a controlled receive device comprising the steps of:

increasing a gain of an amplifier circuit which receives an input signal when a controlled signal from a control circuit connected to said amplifier circuit is less than a controlled threshold level and an output signal of a receiver connected to said control circuit is less than an output threshold level;

decreasing said gain when said controlled signal is greater than said controlled threshold level and said output signal is less than said output threshold level; and maintaining said gain unchanged when said output signal is greater than said output threshold level.

13. The method of claim 12, wherein said output signal is a sum of pilot power signals from fingers of said receiver.

* * * * *